(12) United States Patent
Storms et al.

(10) Patent No.: US 12,333,150 B1
(45) Date of Patent: Jun. 17, 2025

(54) PARTITIONED NON-VOLATILE MEMORY (NVM) HAVING A NORMAL READ BUS AND A VERIFY READ BUS

(71) Applicant: NXP B.V., Eindhoven (NL)

(72) Inventors: Maurits Mario Nicolaas Storms, Best (NL); Jon Scott Choy, Austin, TX (US); Christopher Nelson Hume, Franklin, TN (US); Timothy Strauss, Granger, IN (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/538,451

(22) Filed: Dec. 13, 2023

(51) Int. Cl.
G06F 3/06 (2006.01)

(52) U.S. Cl.
CPC .......... G06F 3/0613 (2013.01); G06F 3/0659 (2013.01); G06F 3/0679 (2013.01)

(58) Field of Classification Search
CPC .......... G06F 3/06; G06F 13/28; G06F 13/122; G06F 13/4247; G06F 13/1684; G06F 13/1605; G06F 13/4022; G06F 13/16; G06F 13/40; G06F 13/4265; G06F 13/4283
See application file for complete search history.

(56) References Cited

U.S. PATENT DOCUMENTS

| | | | |
|---|---|---|---|
| 4,091,461 A | 5/1978 | Booher | |
| 6,260,103 B1 | 7/2001 | Alexis et al. | |
| 8,095,747 B2 * | 1/2012 | Barbara | G06F 13/28 711/212 |
| 8,848,465 B2 | 9/2014 | Kim et al. | |
| 8,995,161 B2 | 3/2015 | Barkley et al. | |
| 9,513,992 B2 | 12/2016 | Mirichigni | |
| 11,056,196 B2 | 7/2021 | Liang et al. | |
| 11,221,764 B2 * | 1/2022 | Miller | G06F 3/0644 |
| 2004/0001380 A1 * | 1/2004 | Becca | G06F 16/90339 365/202 |
| 2005/0216648 A1 * | 9/2005 | Jeddeloh | G06F 13/4022 710/311 |
| 2013/0086334 A1 | 4/2013 | Schuetz | |
| 2021/0349839 A1 * | 11/2021 | Betser | G06F 13/1668 |
| 2023/0395566 A1 | 12/2023 | Vankayala | |

* cited by examiner

Primary Examiner — Khoa D Doan
(74) Attorney, Agent, or Firm — Joanna G. Geld

(57) ABSTRACT

A non-volatile memory (NVM) includes a daisy chained normal read bus, a daisy chained verify read bus, and a plurality of partitions. Each partition includes a portion of the daisy chained normal read bus and a portion of the daisy chained verify read bus. A memory controller receives read data in response to normal read access requests to the NVM via the daisy chained normal read bus and, in response to write access requests to the NVM, receives verify read data via the daisy chained verify read bus. A bus sharing circuit is coupled between a first partition and a second partition. The bus sharing circuit, in response to a sharing control signal, selectively repurposes portions of the daisy chained verify read bus in at least one of the partitions to communicate read data to the memory controller in response to a normal read access request to the NVM.

20 Claims, 9 Drawing Sheets

PARTITIONED NON-VOLATILE MEMORY (NVM) HAVING A NORMAL READ BUS AND A VERIFY READ BUS

BACKGROUND

Field

This disclosure relates generally to memories, and more specifically, to a partitioned non-volatile memory (NVM) having a normal read bus and a verify read bus.

Related Art

Today many non-volatile memory (NVM) designs face bandwidth issues, requiring higher parallelism for the NVM read data path. In one solution, large NVMs are divided into memory tiers or partitions which can be read at the same time, thus increasing bandwidth, however, floor plans are restricted without the availability of additional input/output (I/O) pins. Therefore, even though increased parallelism can be achieved with memory tiers, read bandwidth is restricted due to the restriction on I/Os. Therefore, a need exists for an NVM with improved bandwidth, even with floor plan restrictions.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

It is common for modern safety critical NVMs to require a read verify operation as part of a write operation. In such applications, a separate read verify bus is added in addition to the normal read bus so as not to stall normal reads with verify reads. Therefore, in one aspect, improved read bandwidth and parallelism is achieved in a partitioned NVM by repurposing the verify bus. In one embodiment, each of the normal read bus and the verify read bus are implemented as daisy chained data buses implemented using a set of multiplexors (MUXes) to control data flow from the accessed partition, in which read data from normal reads are provided to the output read bus and verify read data during write operations are used internally by the NVM to verify the write. When a write operation is not occurring, though, the asynchronous verify read bus is repurposed to be part of the synchronous read to provide more effective bits simultaneously to the output read bus. If a write operation is ongoing, then the asynchronous verify read bus is not repurposed but kept separate, resulting in the read bandwidth being cut in half. However, in many applications, read operations far outnumber write operations, meaning that for a majority of the time, the read bandwidth is doubled as compared to not sharing the verify read bus. In one embodiment, a control signal indicating that a write is not occurring can be used to allow for increased bandwidth by repurposing (i.e. sharing) the verify read bus.

Figure 1:
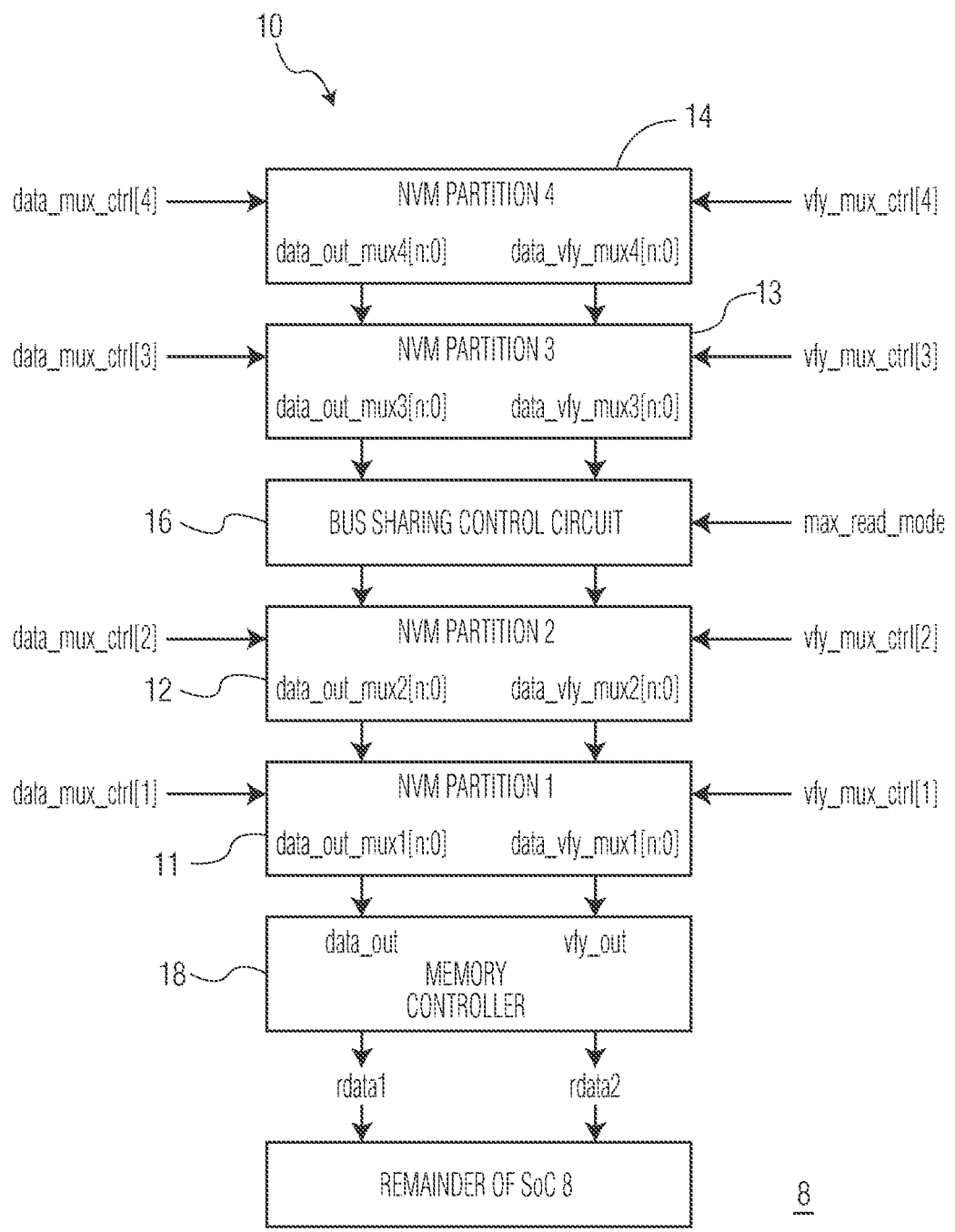
FIG. 1 illustrates, in block diagram form, a partitioned NVM including a bus sharing control circuit, in accordance with one embodiment of the present invention.

FIG. 1 illustrates, in block diagram form, a data processing system having a partitioned NVM 10, in accordance with one embodiment of the present invention. In one embodiment, the data processing system is implemented as part of a system on a chip (SoC) 8, which includes NVM 10. NVM 10 is coupled via two output read ports (i.e. dual output ports), rdata1 and rdata2, to communicate with the remainder of SoC 8. The remainder of SoC 8 can include any type of circuitry, such as, for example, any number of processors, memories, peripherals, etc. Any of the elements of SoC 8 can be configured as a master capable of accessing NVM 10 via read and write access requests. NVM 10 can be any type of NVM, such as, for example, a magnetoresistive random access memory (MRAM), resistive random access memory (ReRAM), etc. NVM 10 is partitioned into four partitions, including partition 1 11, partition 2 12, partition 3 13, and partition 4 14. Note that each may be referred to simply as partition 1, partition 2, partition 3, and partition 4, respectively. In alternate embodiments, NVM 10 can be partitioned into any number of partitions. NVM 10 also includes a memory controller 18 which controls the reads and writes to the partitions. As known in the art, memory controller 18 may receive, with each access request, an access address, control signals (e.g. a read/write (R/W) signal), and, in case of a write access request, corresponding write data. As illustrated in FIG. 1, NVM 10 also includes a bus sharing control circuit 16 which is coupled between partitions 2 and 3. As will be described in more detail below, alternate embodiments may include bus sharing control circuitry between other partitions, as well, or between each adjacent pair of partitions.

For a normal read operation in response to a read access request to NVM 10 (in which the R/W signal indicates a read), memory controller 18 directs a read from a set of memory cells selected by the corresponding read access address in one of the partitions, in which the read data received on the normal read bus of NVM 10, data_out[n:0], can be returned to SoC 8 via an output read bus (i.e. output read port), rdata1 or rdata2. In the illustrated embodiment, memory controller 18 includes access to two different output read busses, in which for each read operation, memory controller 18 can output the read data to either rdata1 or rdata2.

For a write operation in response to a write access request to NVM 10 (in which the R/W signal indicates a write), memory controller 18 directs a write cycle to a set of memory cells selected by the corresponding write access address in one of the partitions, followed immediately by a verify read cycle of the same set of memory cells to verify that the write cycle worked. If not, memory controller 18 directs another write cycle (which may be performed using different write parameters than the previous write cycle, such as higher write voltages, additional write pulses, or the like), followed immediately by another verify read cycle. Memory controller 18 continues performing write cycles to the selected set of memory cells and subsequent verify reads from the selected set of memory cells until the write operation is verified as complete. Note that the verify read data received by memory controller 18 on the verify read bus of NVM 10, vfy_out[n:0], during the write operation is used to internally verify the previous write cycle, and is therefore not provided by memory controller 18 to an output read bus. That is, unlike data_out[n:0] which is output to SoC 8 via rdata1 or rdata2, vfy_out[n:0] is not provided to the remainder of SoC 8 and does not appear on either rdata1 or rdata2.

Each partition includes corresponding row and column decoders, corresponding read circuitry (including sense amplifiers), and corresponding write circuitry to perform read and write operations in the partition, in which the row and column decoders, read circuitry and write circuitry can be implemented as known in the art. Each partition also includes circuitry required to put local read data from the partition onto the normal read bus, data_out[n:0], to memory controller 18 and to put local verify read data from the partition onto the verify read bus, vfy_out[n:0], to memory controller 18. In the illustrated embodiment, each read or write operation is performed with n+1 bits of data, and therefore the regular read bus and verify read bus each communicate n+1 bits. In one embodiment, n=255 such that each read operation reads 256 bits and each write operation writes 256 bits. However, different embodiments n may be any number of bits. As will be described below, each of the normal read bus and the verify read bus is implemented using daisy chained MUXes.

As will be described in more detail below, each partition includes a MUX which can either provide read data from within the partition or pass incoming read data from another partition out onto the partition's read output. The MUXes of the partitions are all daisy chained such that read data is propagated through each partition, in turn, along the daisy chain order, starting with the partition from which the read data originated, until reaching memory controller 18 as data_out[n:0]. Similarly, each partition also includes a verify MUX which can either provide verify read data from the partition or pass incoming verify read data from another partition out onto the partition's verify output. The verify MUXes are similarly daisy chained such that the verify read data is propagated through each partition, in turn, along the daisy chain order, starting with the partition from which the verify read data originated, until reaching memory controller 18. In the illustrated embodiment, the MUXes of the partitions of NVM 10 are daisy chained in order from the highest numbered partition (partition 4) to the lowest numbered partition (partition 1). Therefore, read data or verify read data is propagated along the daisy chain from the higher number partition to the lower number partition. For example, if read data or verify read data is accessed from partition 3, the read data or verify read data is next transparently propagated through partition 2 then partition 1 to memory controller 18, in which, with respect to partition 3, partition 4 is considered the "previous partition" and partition 2 "the subsequent partition" or "the next partition." Daisy chaining the normal read bus and verify read buses allows each bus to access all the partitions, while requiring only n+1 bit lines to communicate between any of the partitions and with memory controller 18.

Figure 2:
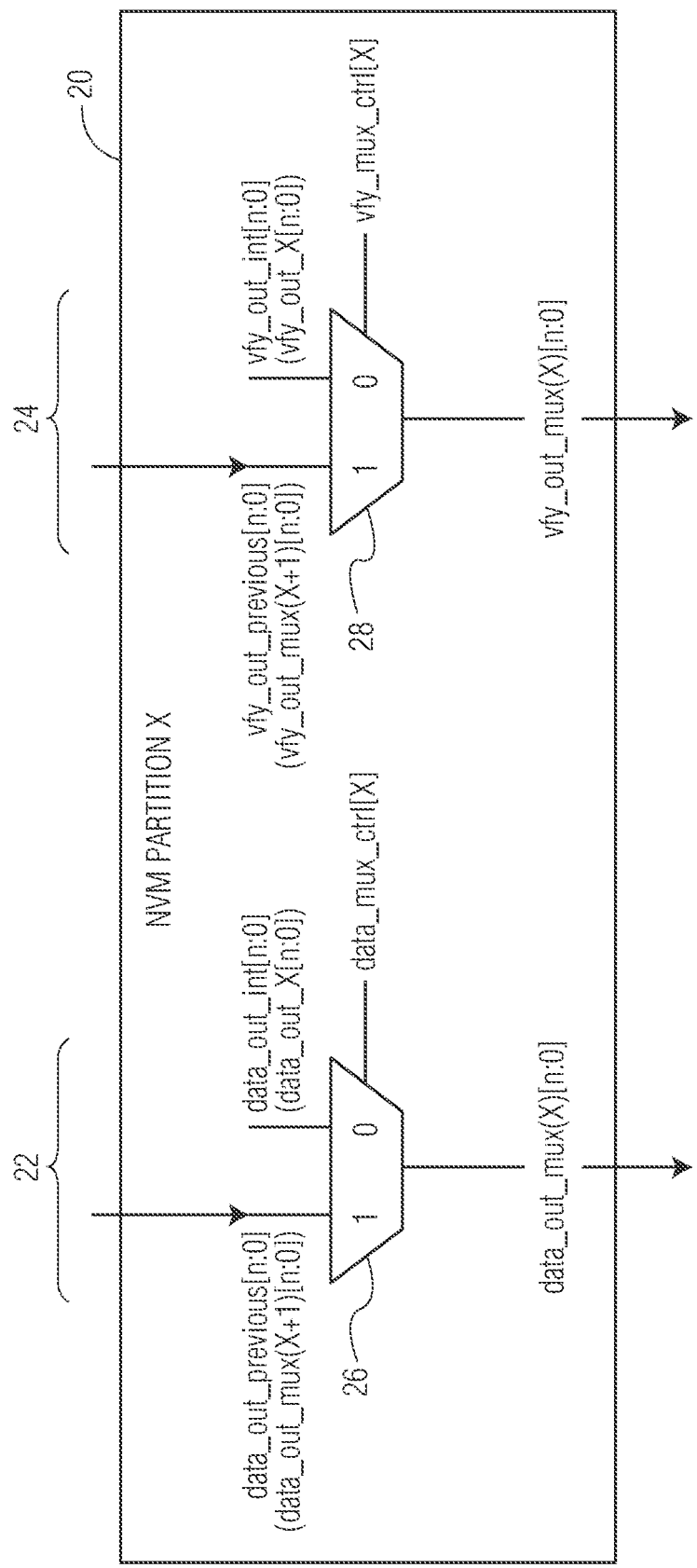
FIG. 2 illustrates, in block diagram form, one of the partitions of the NVM of FIG. 1, in accordance with one embodiment of the present invention.

FIG. 2 illustrates, in block diagram form, a portion of a daisy chained normal read bus 22 and a portion of a daisy chained verify read bus 24 located in a partition X of NVM 10, in which X can be any of the partitions of NVM 10, and in which, with reference to partition X, partition X+1 is considered the previous partition in the daisy chain and partition X−1 is considered the subsequent partition in the daisy chain. The portion of each bus includes a MUX (corresponding to a set of n+1 MUXes) which receives data from a previous partition as well as data from the partition itself (i.e. internal partition data), and, in accordance with a corresponding MUX control signal, provides one of these two to subsequent portions of the buses in the subsequent partitions. Portion of daisy chained normal read bus 22 propagates read data to data_out[n:0] at memory controller 18, while portion of daisy chained verify read bus 24 propagates verify read data to vfy_out[n:0] at memory controller 18.

For example, portion of daisy chained normal read bus 22 includes a MUX 26 which receives, at a first data input, data_out_previous[n:0] from a previous partition (X+1), and, at a second data input, data_out_int[n:0] from the internal partition (X). MUX 26 receives a corresponding control signal, data_mux_ctrl[X], and based on the value of data_mux_ctrl[X], outputs one of data_out_previous[n:0] or data_out_int[n:0] as the partition's read output, data_out_mux(X)[n:0]. In the illustrated embodiment, when data_mux_ctrl[X] is asserted to a logic level one, MUX 26 operates transparently to provide data_out_previous[n:0] as data_out_mux(X)[n:0] and when negated to a logic level zero, provides data from partition X itself, data_out_int[n:0], as data_out_mux(X)[n:0]. Therefore, note that data_out_previous[n:0] corresponds to the data_out_MUX of a MUX in the previous partition of the daisy chain and thus can be referred to as data_out_mux(X+1)[n:0], and since data_out_int[n:0] provides data from the partition itself, it can be referred to as data_out_X[n:0].

Note that analogous descriptions apply to portion of daisy chained verify read bus 24, including a MUX 28 which receives, at a first data input, vfy_out_previous[n:0] from a previous partition (X+1), and, at a second data input, vfy_out_int[n:0] from the internal partition (X). MUX 28 receives a corresponding control signal, vfy_mux_ctrl[X], and based on the value of vfy_mux_ctrl[X], outputs one of vfy_out_previous[n:0] or vfy_out_int[n:0] as the partition's verify output, vfy_out_mux(X)[n:0]. In the illustrated embodiment, when vfy_mux_ctrl[X] is asserted to a logic level one, MUX 28 operates transparently to provide vfy_out_previous[n:0] as vfy_out_mux(X)[n:0] and when negated to a logic level zero, provides data from partition X itself, vfy_out_int[n:0], as vfy_out_mux(X)[n:0]. Therefore, note that vfy_out_previous[n:0] corresponds to the vfy_out_mux of a MUX in the previous partition of the daisy chain and thus can be referred to as vfy_out_mux(X+1)[n:0], and since vfy_out_int[n:0] provides data from the partition itself, it can be referred to as vfy_out_X[n:0].

Note that while each of the data MUX and verify MUX of partition X of FIG. 2 are illustrated as a single MUX, each represents a set of n+1 MUXes, so as to provide the full bus width of n+1 bits. Therefore, MUX 26 is implemented with a set of n+1 MUXes, each coupled to receive a corresponding one of the n+1 bits of data_out_previous[n:0] and of data_out_int[n:0] and coupled to provide the corresponding one of the n+1 bits of data_out_mux(X)[n:0]. The same applies to MUX 28, which is also implemented as a set of n+1 MUXes. Note that, for improved readability, the signals may sometimes be referred to herein without the "[n:0]" explicitly following the signal name. Note also that in alternate embodiments, different implementations and different logic circuitry may be used to implement the functionality of the MUXes of the daisy chained buses. Also, in alternate embodiments, the MUXes of the partitions can be daisy chained in a different daisy chain order other than in decreasing numbered order from partition 4 to partition 1, such as in increasing numbered order from partition 1 to partition 4 or in any other order. For example, if the MUXes are daisy chained in increasing order from partition 1 to partition 4, then with reference to a given partition X, X−1 may correspond to the previous partition in the daisy chain and X+1 to the next partition in the daisy chain.

As illustrated in FIG. 1, each of partition 4 through 1 of NVM 10 receives a corresponding data MUX control signal [X] (one of data_mux_ctrl[4:1]) and a corresponding verify MUX control signal [X] (one of vfy_mux_ctrl[4:1]). Using partition 3 as an example, partition 3 receives read data from a previous partition (data_out_mux4[n:0]), verify read data from a previous partition (vfy_out_mux4[n:0]), and generates output read data (data_out_mux3[n:0]) and output verify read data (vfy_out_mux3[n:0]), based on data_mux_ctrl[3] and vfy_mux_ctrl[3], respectively, in which both outputs may be provided to a subsequent partition. As will be seen in examples provided below, read data and verify data propagate from higher numbered partitions down to lower numbered partitions in the daisy chain. That is, if the read data or verify read data originates from partition 3, the control on the data MUX or verify MUX, respectively, is set to provide the internal selection as the output, and the controls on the data MUXes or verify MUXes, respectively, of the lower partitions (partitions 2 and 1) are set so as to transparently provide the read data or verify data through the partition. Note that the MUX controls of higher partitions than the partition from which the read data or verify read data originates can be treated as "don't cares."

Still referring to FIG. 1, bus sharing control circuit 16 is coupled between partition 3 and partition 2, and receives a sharing control signal, max_read_mode, which either enables bus sharing or bus repurposing (when max_read_mode is asserted to a logic level one) or disables bus sharing or bus repurposing (when max_read_mode is negated to a logic level zero). In operation, when bus sharing control circuit 16 disabled, bus sharing circuit 16 operates transparently, in which normal read operations from a partition provide read data via the normal read bus as data_out to memory controller 18, and verify read operations from a partition (during a write to the partition) provide verify read data via the verify read bus to memory controller 18. In this case, repurposing is disabled such that normal read data is not provided via the verify read bus, and verify read data is not provided via the normal read bus. However, when bus sharing is enabled (i.e. when repurposing is enabled), bus sharing control circuit 16 allows for at least a portion of the verify read bus to be repurposed and used as part of the normal read bus in order to increase read bandwidth. Memory controller 18 may allow such repurposing when, for example, writes are not occurring in NVM 10 and may do so by asserting max_read_mode.

With bus sharing enabled, if read data is obtained from partition 3, rather than propagating the read data exclusively through the normal read bus through the data MUXes of partitions 2 and 1 as data_out to memory controller 18, the read data, upon reaching bus sharing control circuit 16, is instead routed through the verify read bus through the verify MUXes of partitions 2 and 1 and instead provided as vfy_out to memory controller 18. However, in this case, memory controller 18 places the read data received from vfy_out onto a read output bus, such as rdata1 or rdata2, to be sent to SoC 8. That is, vfy_out can either receive verify data due to verify read operations or read data due to normal read operations, depending on whether bus sharing is enabled or not.

Figure 3:
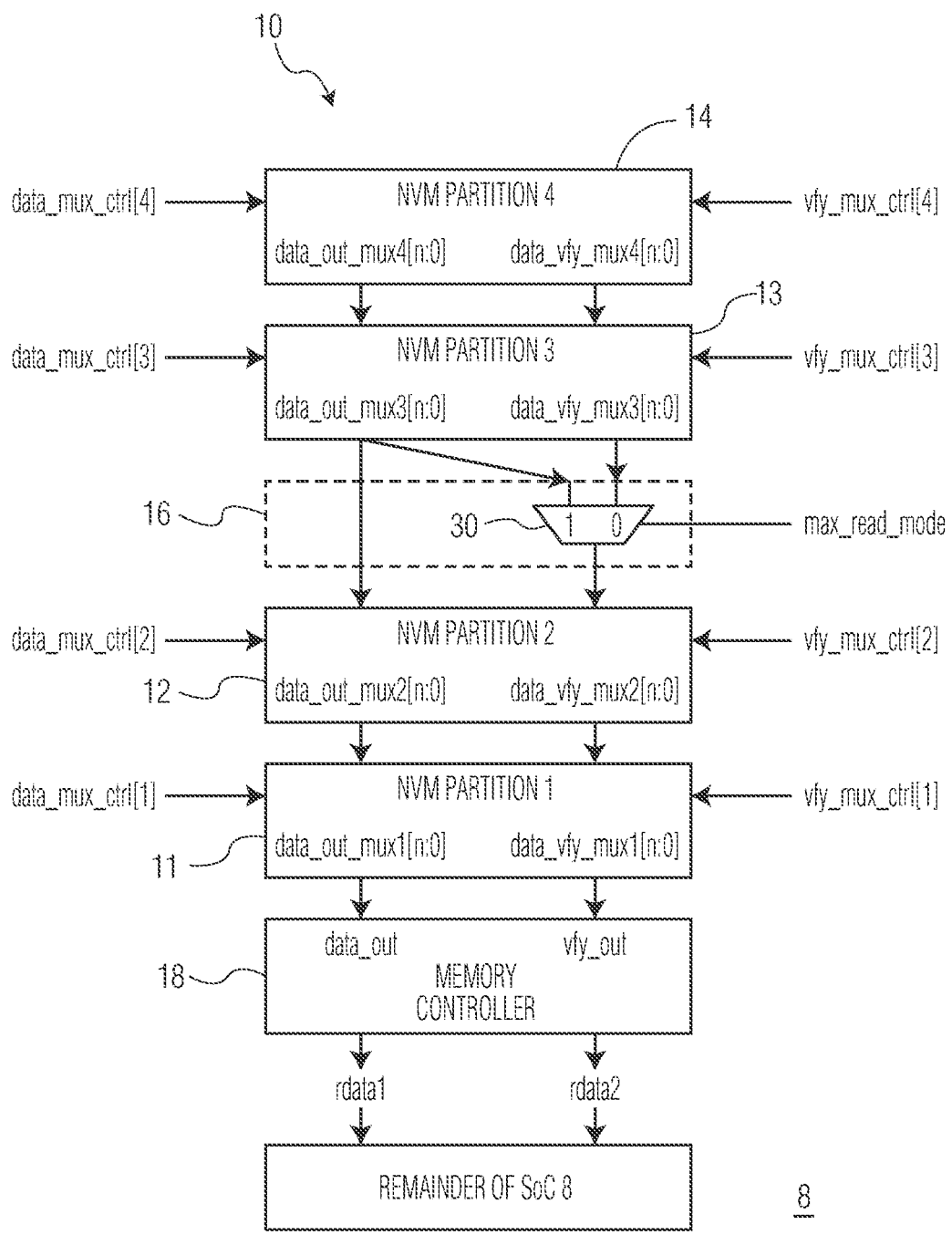
FIG. 3 illustrates, in block diagram form, a more detailed view of the partitioned NVM of FIG. 1, including further details of the bus sharing control circuit, in accordance with one embodiment of the present invention.

FIG. 3 illustrates, in block diagram form, NVM 10 with a more detailed view of bus sharing control circuit 16, located between partitions 3 and 2, in accordance with one embodiment of the present invention. In the illustrated embodiment, bus sharing circuit 16 includes a MUX 30, in which a first data input is coupled to receive data_out_mux3[n:0], a second data input is coupled to receive vfy_out_mux3[n:0], and provides one of these as the vfy_out_previous[n:0] of partition 2 (i.e. as the vfy_out_mux3[n:0] used in partition 2), based on max_read_mode at the control input of MUX 30. Therefore, note that data_out_mux3[n:0] is provided both as an input to partition 2 and input to MUX 30. Also, note that vfy_out_previous[n:0] received by partition 2 can either be data_out_mux3[n:0] from partition 3 or vfy_out_mux3[n:0] from partition 3, depending on the value of max_read_mode.

Note that, as with FIG. 2, although MUX 30 is illustrated as a single MUX, it represents a set of n+1 MUXes (each coupled to receive a corresponding one of the n+1 bits of the normal read bus and of the verify read bus). Therefore, if max_read_mode is negated, bus sharing circuit 16 is transparent such that the outputs of the normal read bus and verify read bus of partition 3 are provided, unchanged, as inputs to the normal read bus and verify read bus of partition 2, respectively. However, if max_read_mode is asserted, bus sharing circuit 16 routes the outputs of the normal read bus of partition 3 to the inputs of the verify read bus of partition 2. In this manner, read data received via the normal read bus of partition 3 is instead propagated through the verify read bus of partitions 2 and 1.

In the illustrated embodiment, bus sharing control circuit 16 is located between partitions 3 and 2, such that any routing of read data or verify read data in partitions 3 and higher use the corresponding normal read bus or verify read bus, respectively, regardless of whether or not bus sharing is enabled. However, if bus sharing is enabled, partitions 2 and lower route normal read data from either partition 3 or partition 4 through the verify read bus instead of through the normal read bus to memory controller 18. If bus sharing control circuit were instead located between portions 2 and 1, then bus sharing, if enabled, would not begin until the read data reached partition 1 instead of partition 2. In yet other alternate embodiments, a bus sharing circuit such as bus sharing circuit 16 can be used between any two partitions, or can be used between multiple adjacent pairs of partitions (in which adjacent pairs are those which are adjacent along the daisy chain order). In this case, each bus sharing control circuit may receive the same sharing control signal (max_read_mode) or may have its own corresponding sharing control signal which may be different from that received by other bus sharing control circuits. However, in the examples illustrated in FIGS. 5-8 below, it is assumed that bus sharing circuit 16 is only utilized between partitions 3 and 2.

Figure 4:
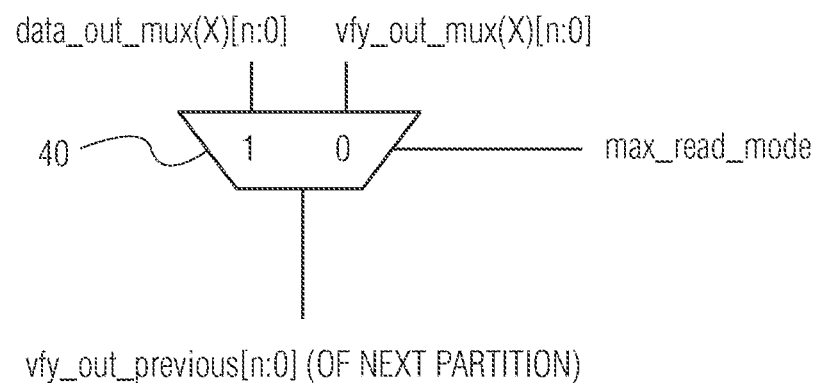
FIG. 4 illustrates, in block diagram form, a portion of a bus sharing control circuit in accordance with one embodiment of the present invention.

FIG. 4 illustrates, in block diagram form, an implementation of a bus sharing circuit which can be used between any two partitions of NVM 10, e.g. between partition X and subsequent partition X-1, in accordance with one embodiment of the present invention. In the illustrated embodiment of FIG. 4, the bus sharing circuit includes a MUX 40, in which a first data input is coupled to receive data_out_mux (X), a second data input is coupled to receive vfy_out_mux (X), and provides one of these at an output of MUX 40 as vfy_out_previous[n:0] of the next partition X-1 (i.e. as the vfy_out_mux(X)[n:0] used in the next partition X-1), based on max_read_mode at the control input of MUX 40. Therefore, note that data_out_mux(X)[n:0] is provided both as an input to the next partition X-1 and as an input to MUX 40. Also, note that vfy_out_previous[n:0] received by the next partition X-1 can either be data_out_mux(X)[n:0] or vfy_out_mux(X)[n:0], depending on the value of max_read_mode.

Note that, as with FIGS. 2 and 3, although MUX 40 is illustrated as a single MUX, it represents a set of n+1 MUXes (each coupled to receive a corresponding one of the n+1 bits of the normal read bus and of the verify read bus). Therefore, if max_read_mode is negated, MUX 40 allows the bus sharing circuit to operate transparently such that the outputs of the normal read bus and verify read bus of partition X are provided, unchanged, as inputs to the normal read bus and verify read bus of the next partition, respectively. However, if max_read_mode is asserted, MUX 40 routes the outputs of the normal read bus of partition X to the inputs of the verify read bus of the next partition. In this manner, read data received via the normal read bus of the partition of partition X is instead propagated through the verify read buses of each subsequent partition.

Figure 5:
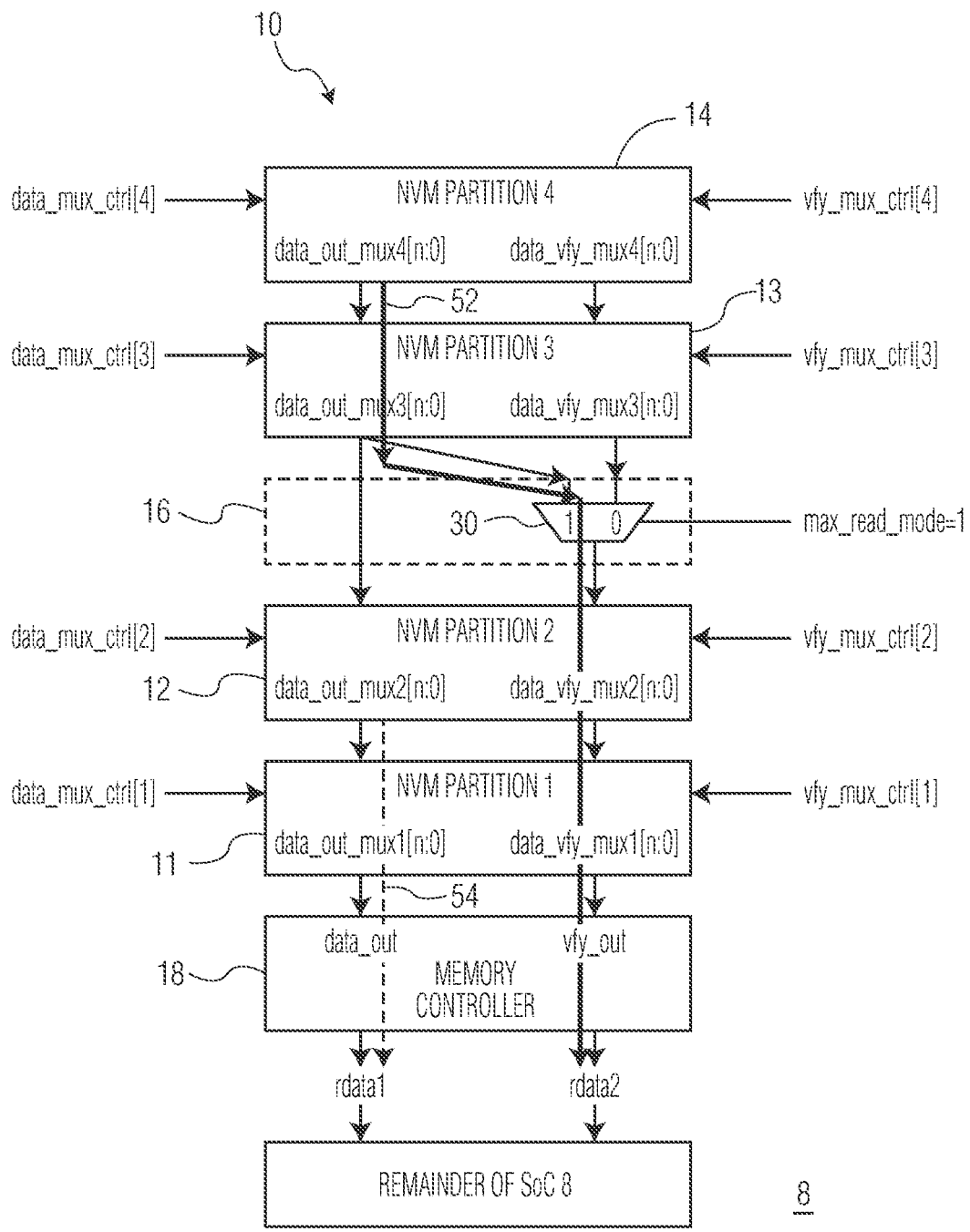
FIG. 5 illustrates, in diagrammatic form, a data flow in the NVM of FIG. 3, in accordance with one example operation of the NVM.
Figure 6:
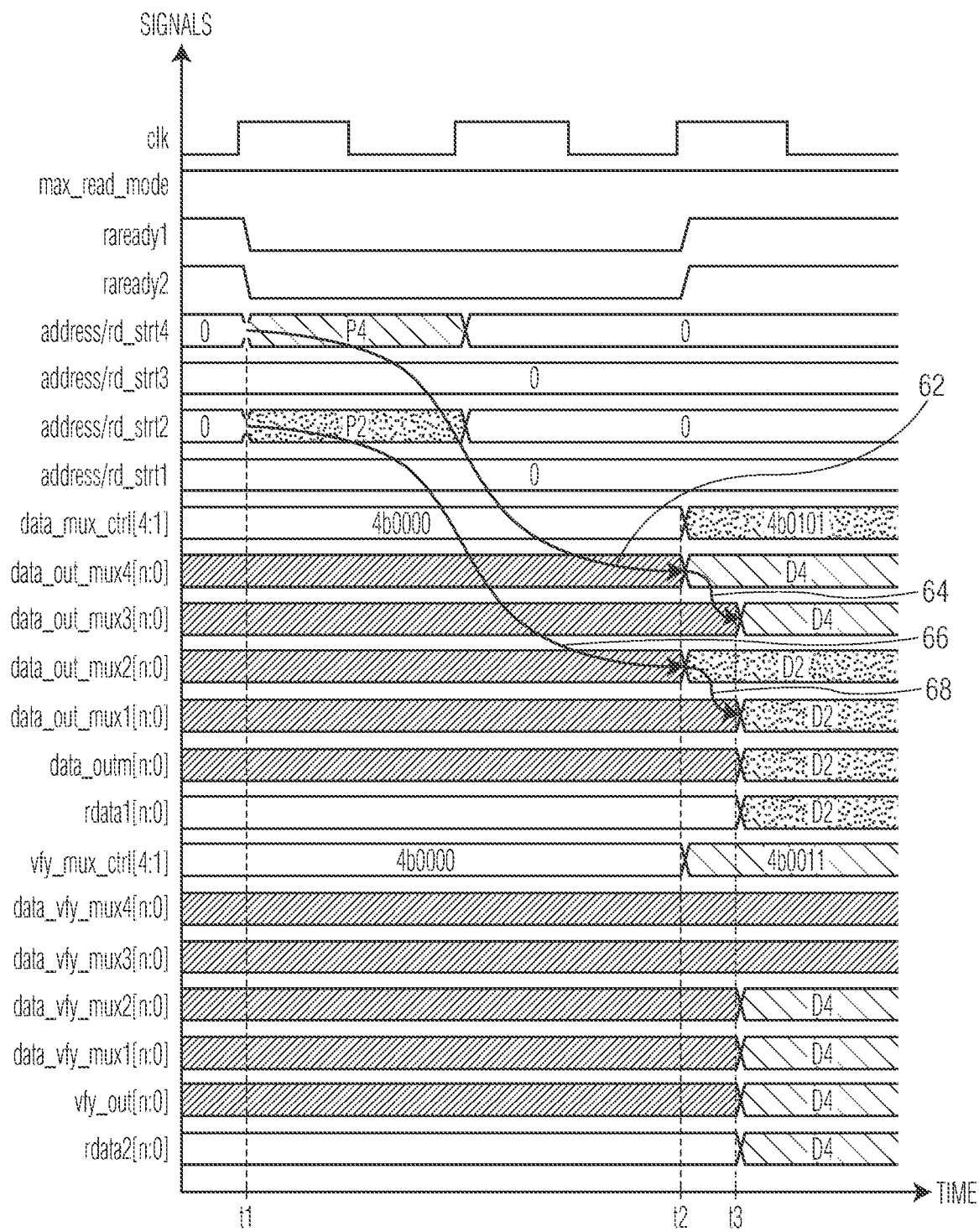
FIG. 6 illustrates a timing diagram of various signals within the NVM of FIG. 3 during the example operation of FIG. 5.

FIG. 5 illustrates NVM 10 of FIG. 3 with data flow arrows 52 and 54 indicating the data flow for read data in accordance with a first example in which max_read_mode is asserted (thus enabling bus sharing). FIG. 6 illustrates a timing diagram of various signals in NVM 10 of FIG. 5 corresponding to the first example of FIG. 5. Therefore, FIG. 6 will be described in reference to NVM 10 of FIG. 5.

In the first example of FIG. 5, simultaneous normal read access requests (as opposed to verify reads) are received by memory controller 18 of NVM 10, including a first read access request to partition 4 and a second read access request to partition 2. Therefore, at time t1, an access address (P4) is provided to partition 4, indicating the start of the first normal read access to P4, and an access address (P2) is provided to partition 2, indicating the start of the second normal read access to P2. As illustrated in FIG. 6, memory controller 18 has asserted max_read_mode to a logic level one such that bus sharing circuit 16 between partitions 3 and 2 is enabled. Therefore, at time t2, memory controller 18 provides data_mux_ctrl[4:1] as 4b0101 and vfy_mux_ctrl [4:1] as 4b0011. Note that, as used herein, the "b" preceding a string of 1's and 0's indicates that the string of 1's and 0's represents a binary value, and the positive integer preceding the "b" indicates the number of bits in the binary value. (In one embodiment, as will be described in further detail below with respect to FIG. 9, the received access addresses, e.g. P2 and P4, can be communicated through the partitions using bus sharing as well.)

At time t2, with data_mux_ctrl[4:1] set to 4b0101, the set of MUXes in partition 4 (in which data_mux_ctrl[4]=0) outputs the internal read data (data_out_int=D4) stored at address P4 such that data_out_mux4[n:0]=D4. (Therefore, the read data D4 is provided as data_out_mux4 in response to receiving read address P4 for the first read access, as indicated by arrow 62.) Subsequently, at time t3, the set of MUXes in partition 3 (in which data_mux_ctrl[3]=1), operate transparently so as to output D4 (data_out_previous=D4) such that data_out_mux3[n:0]=D4 as well. (Therefore, the read data D4 is subsequently provided as data_out_mux3 due to the daisy chaining of the MUXes of the normal read bus, as indicated by arrow 64.) If bus sharing (and thus repurposing) were not enabled, data_mux_ctrl[2] and data_mux_ctrl[1] would each also be set to 1 so as to transparently propagate the read data D4, unchanged, to controller 18 as data_out. Although, if this were the case, another read cannot yet occur since the normal read bus is occupied.

However, in the illustrated case, bus sharing (i.e. repurposing) is enabled, with max_read_mode=1 and vfy_mux_ctrl[4:1] set to 4b0011. Therefore, the read data D4 output as data_out_mux3 at time t3 is provided, via MUX 30, to the set of verify MUXes in partition 2. With vfy_mux_ctrl[2] and vfy_mux_ctrl[1] each set to 1, the verify MUXes in each of partition 2 and partition 1 operate transparently so as to propagate read data D4 to vfy_out[n:0]. Therefore, as illustrated at time t3 in FIG. 6, each of data_out_mux3[n:0] (of the normal read bus), data_vfy_mux2[n:0] (of the verify read bus), and data_vfy_mux1 [n:0] (also of the verify read bus) propagate the read data D4 for the first read access, and it is received by controller 18 as vfy_out[n:0]. Therefore, the data flow for read data D4 is represented by data flow arrow 52 of FIG. 5, in which the read data D4 is read from partition 4, propagated, unchanged, through partition 3 on the normal read bus, switched over to the verify read bus by MUX 30, and propagated, unchanged, through partitions 2 and 1 on the verify read bus.

Since read data D4, after partition 3, transfers to the verify read bus of partitions 2 and 1, the normal read bus of partitions 2 and 1 are available to service the second read access. Therefore, at time t2, the set of MUXes in partition 2 (in which data_mux_ctrl[2]=0) outputs the internal read data (data_out_int=D2) stored at address P2 such that data_out_mux2[n:0]=D2. (Therefore, the read data D2 is provided as data_out_mux2 in response to receiving read address P2 for the second read access, as indicated by arrow 66.) At time t3, the set of MUXes in partition 1 (in which data_mux_ctrl[1]=1), operate transparently so as to output D2 (data_out_previous=D2) such that data_out_mux1[n:0]=D2 as well. (Therefore, the read data D2 is subsequently provided as data_out_mux2 due to the daisy chaining of the MUXes of the normal read bus, as indicated by arrow 68.) Therefore, the data flow for read data D2 is represented by data flow arrow 54 of FIG. 5 (illustrated as a dashed arrow), in which the read data D2 is read from partition 2 and propagated, unchanged, through partition 1 on the normal read bus.

In this example, memory controller 18 can connect data_out[n:0] to rdata1[n:0] (in which raready1 is asserted indicating data is ready on rdata1) to output read data D2 from NVM 10 to SoC 8, and connect vfy_out[n:0] to rdata2[n:0] (in which raready2 is asserted indicating data is ready on rdata2) to output read data D4 from NVM 10 to SoC 8. In this manner, simultaneous read requests received at time t1 can return corresponding read data onto the ports of NVM 10 (rdata1 and rdata2), simultaneously, at time t3. Therefore, with bus sharing enabled, any read from a partition before bus sharing circuit 16 (e.g. from partition 4 or partition 3) can be performed simultaneous with any read from a partition after bus sharing circuit 16 (e.g. from partition 2 or partition 1). In general, with bus sharing enabled in which the verify read bus can be repurposed as a portion of the normal read bus, read data for a normal read access from the partitions before the bus sharing circuit is communicated on the normal read bus prior to the bus sharing circuit but then communicated on the repurposed verify read bus after the bus sharing circuit. This opens up the availability of the normal read bus in the partitions after the bus sharing circuit. Also note that with bus sharing enabled, the verify mux control signals of the partitions before the bus sharing circuit (e.g. vfy_mux_ctrl[4:3]) do not matter and can be treated as "don't cares" because the verify read bus in those partitions is not being used as a verify read bus nor being repurposed as a normal read bus.

Figure 7:
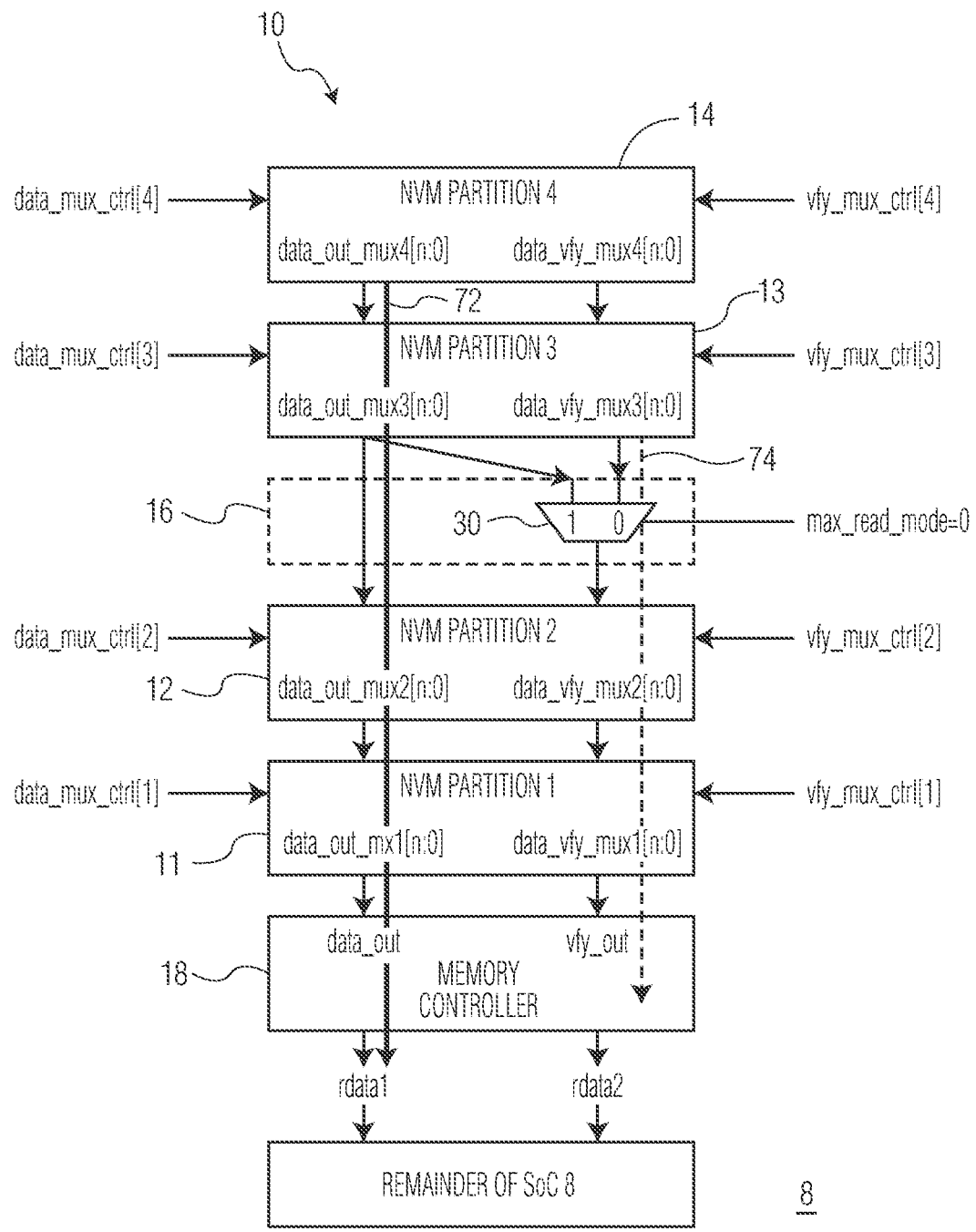
FIG. 7 illustrates, in diagrammatic form, a data flow in the NVM of FIG. 3, in accordance with one example operation of the NVM.
Figure 8:
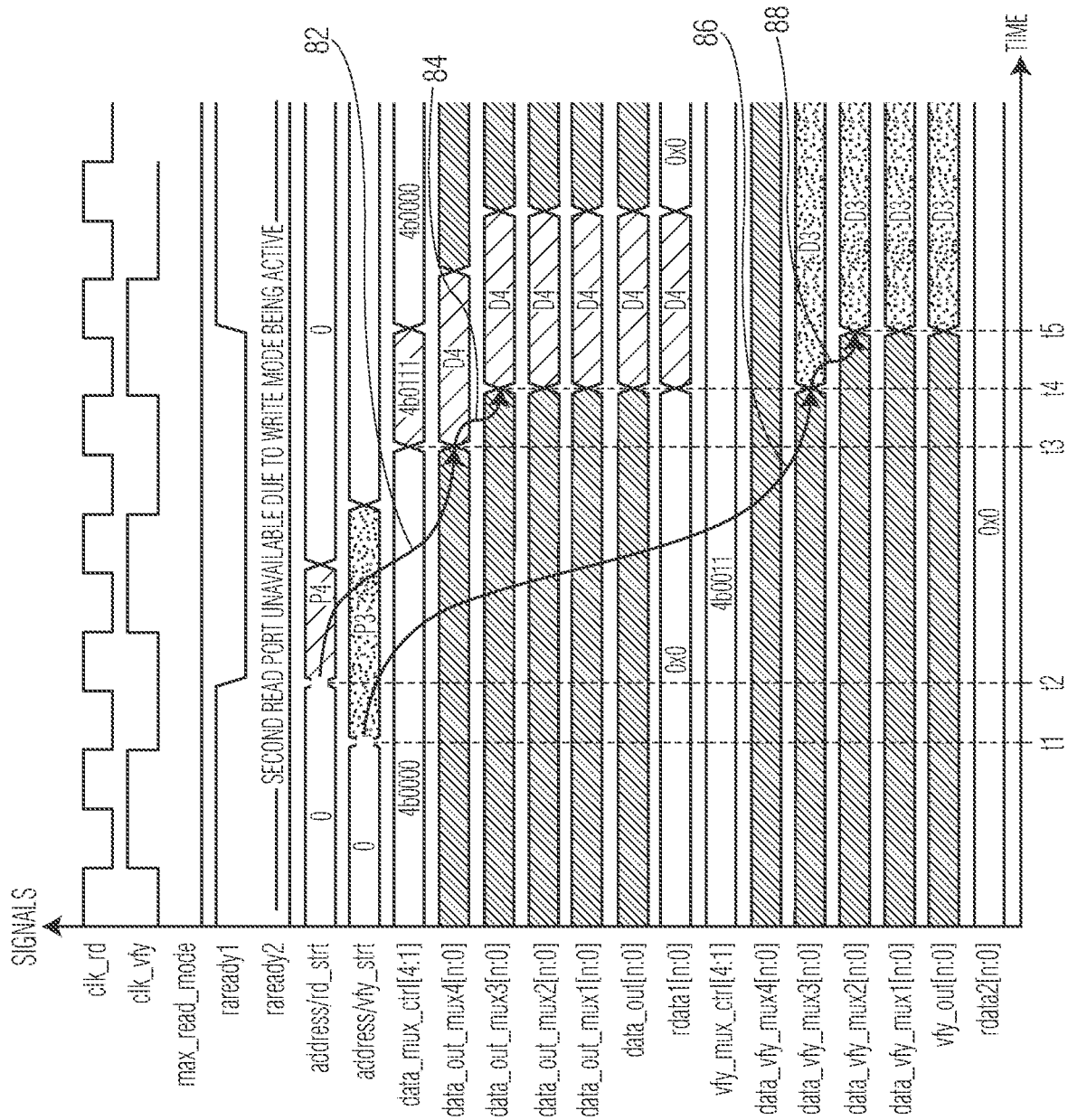
FIG. 8 illustrates a timing diagram of various signals within the NVM of FIG. 3 during the example operation of FIG. 7.

FIG. 7 illustrates NVM 10 of FIG. 3 with data flow arrows 72 and 74 indicating the data flow for read data in accordance with a second example in which max_read_mode is negated (thus disabling bus sharing). FIG. 8 illustrates a timing diagram of various signals in NVM 10 of FIG. 7 corresponding to the second example of FIG. 7. Therefore, FIG. 8 will be described in reference to NVM 10 of FIG. 7.

In the second example of FIG. 7, a normal read access request to partition 4 is received by memory controller 18 during an ongoing write operation in partition 3 (i.e. a read-while-write (RWW) operation). As part of the write operation in partition 3 to write access address P3, verify reads are performed from P3, as was described above in which a write operation includes a series of write cycles to the write access address, each followed by a verify read cycle from the write access address, until the verify read cycle indicates the write operation is complete. Therefore, at time t1 of FIG. 8, the access address (P3) is provided to partition 3, indicating the start of a verify read from P3. At a later time, t2, an access address (P4) is provided to partition 4, indicating the start of a normal read access to P4. As illustrated in FIG. 8, memory controller 18 has negated max_read_mode to a logic level zero during the write operation to partition 3 such that bus sharing circuit 16 between partitions 3 and 2 is disabled.

For the ongoing write operation in partition 3, memory controller 18 provided vfy_mux_ctrl[4:1] as 4b0011. Therefore, the set of verify MUXes in partition 3 (with vfy_mux_ctrl[3]=0) outputs, at time t4, the internal verify read data (vfy_out_int=D3) stored at P3 such that data_vfy_mux3[n:0]=D3. (Therefore, the verify read data D3 is provided as data_vfy_mux3 in response to receiving write access address P3 for the verify read, as indicated by arrow 86.) At time t5, the set of MUXes in partitions 2 and 1 (in which each of vfy_mux_ctrl[2] and vfy_mux_ctrl[1] is set to 1) operate transparently so as to propagate D3 on the verify read bus to vfy_out[n:0]. (Therefore, the verify read data D3 is subsequently provided as data_vfy_mux2 due to the daisy chaining of the MUXes of the verify read bus, as indicated by arrow 88, and similarly, as data_vfy_mux1.)

For the normal read access request to partition 4, memory controller 18 provides data_mux_ctrl[4:1] as 4b0111 at time t3. Therefore, the set of MUXes in partition 4 (with data_mux_ctrl[4]=0) outputs, at time t3, the internal read data (data_out_int=D4) stored at P4 such that data_out_mux4[n:0]=D4. (Therefore, the read data D4 is provided as data_out_mux4 in response to receive access address P4 for the normal read access, as indicated by arrow 82.) At time t4, the set of MUXes in partitions 3, 2, and 1 (in which each of data_mux_ctrl[3], data_mux_ctrl[2], and data_mux_ctrl[1] is set to 1) operate transparently so as to propagate D4 on the normal read bus to data_out[n:0]. Therefore, the read data D4 is subsequently provided as data_out_mux3 due to the daisy chaining of the MUXes of the normal read bus, as indicated by arrow 84, and similarly, as data_out_mux2 and as data_out_mux1.)

With bus sharing disabled, the read data for the normal read access remains on the normal read bus, and the verify read data remains on the verify read bus, and no portion of the verify read bus is repurposed as a part of the normal read bus. Therefore, the data flow for read data D4 is represented by data flow arrow 72 of FIG. 7, in which the read data D4 is read from partition 4 and propagated, unchanged, through partitions 3, 2, and 1 on the normal read bus (without being provided via MUX 30), and the data flow for verify ready data D3 is represented by data flow arrow 74 of FIG. 7 (illustrated as a dashed arrow), in which the verify read data D3 is read from partition 3 onto the verify read bus, provided to partition 2 via MUX 30, and propagated, unchanged, through partitions 2 and 1 of the verify read bus. In this example of a RWW, since a write operation is occurring, controller 18 can disable bus sharing (i.e. negate max_read_mode) which reduces bandwidth as compared to the example of FIGS. 5 and 6, but leaves the verify read bus dedicated to the write verify data propagation so as to more efficiently perform the RWW.

In the illustrated example, memory controller 18 can connect data_out[n:0] to rdata1[n:0] (in which raready1 is asserted to a logic level one indicating data is ready on rdata1) to output read data D4 from NVM 10 to the SoC. However, raready2 remains negated at a logic level zero because the port rdata2 is not enabled in this case, making rdata2 inaccessible by SoC 8 during the write operation. That is, the verify read data D3 is only used internally by memory controller 18 in performing the write operation to P3 and is not communicated externally to SoC 8.

Figure 9:
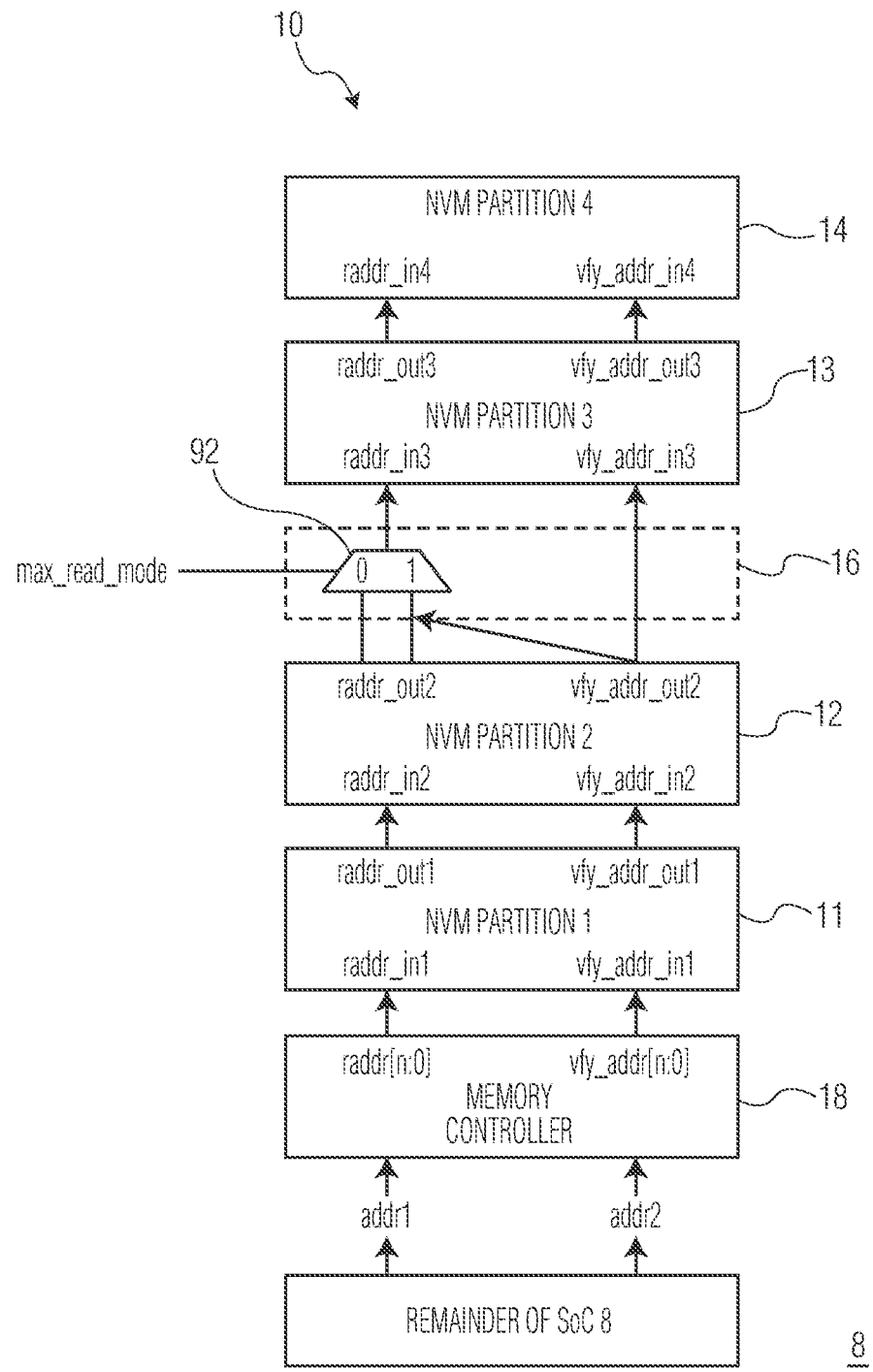
FIG. 9 illustrates, in block diagram form, a more detailed view of the partitioned NVM of FIG. 1, including further details of the bus sharing control circuit, in accordance with one embodiment of the present invention.

FIG. 9 illustrates, in block diagram form, NVM 10 of FIG. 3, but further illustrating a normal read address bus (raddr[n:0]) and a verify read address bus (vfy_addr[n:0]), including bus sharing control circuit 16, located between partitions 3 and 2, in accordance with one embodiment of the present invention. NVM 10 is coupled via two input address ports (i.e. dual input address ports), addr1 and addr2, to receive a read or write access address from the remainder of SoC 8 (such as from a master of SoC 8 providing a read or write access request, respectively, to NVM 10). For example, for a normal read operation in response to a read access request to NVM 10 (in which the R/W signal indicates a read), memory controller 18 receives the access address for the read access request via addr1 or addr2, and propagates the access address to each of partitions 1-4 via a normal read address bus. Each partition includes an input from the normal read address bus (raddr_inX[n:0]) and an output to the normal read address bus (raddr_outX[n:0]), in which X refers to the corresponding partition number. Memory controller 18 provides the (n+1)-bit access address to the normal read address bus via output raddr[n:0]. As an example, memory controller 18 provides the access address to raddr_in1 of partition 1, which then provides the access address via radd_out1 to raddr_in2 of partition 2, etc. In this manner, the access address is propagated through all the partitions.

For a write operation in response to a write access request to NVM 10 (in which the R/W signal indicates a write), memory controller 18 directs a write cycle to the set of memory cells selected by the corresponding write access address in one of the partitions, followed immediately by a verify read cycle of the same set of memory cells to verify that the write cycle worked, as described above. The write and verify read cycle can be repeated, as needed, until the write operation is verified complete. Memory controller 18 receives the write access address via addr1 or addr2, and propagates the write access address to the partitions via, for example, a write address bus. The write address bus can be the same as the verify read address bus, or a separate write address bus (not illustrated in FIG. 9). For each verify read cycle, the write access address of the write operation is provided to the partitions as the read access address on the verify read address bus. Therefore, similar to the normal read address bus, each partition includes an input from the verify read address bus (vfy_addr_inX[n:0]) and an output to the verify read address bus (vfy_addr_outX[n:0]). Memory controller 18 provides the (n+1)-bit write access address to the verify read address bus via output vfy_addr [n:0]. As an example, memory controller 18 provides this access address to vfy_addr_in1 of partition 1, which then provides this access address via vfy_add_out1 to vfy_addr_in2 of partition 2, etc. In this manner, the access address is propagated through all the partitions. In one embodiment, within each partition, the access address provided along either address bus can be buffered, as needed. (Note that each bus input and output includes n+1 bits, however, the "[n:0]" is not included in the labels of FIG. 9.)

In the illustrated embodiment, in addition to MUX 30 for the normal read and verify read data buses described above, bus sharing circuit 16 further includes a MUX 92 for the normal read and verify read address buses. (Note that the data buses and MUX 30 are not illustrated in FIG. 9 so as not to clutter the drawing.) While the address buses are not daisy chained as the data buses are, bus sharing circuit 16 may also allow for the repurposing of the verify read address bus for use by normal read access addresses received with normal read access requests. As illustrated in FIG. 9, MUX 92 has a first data input coupled to receive raddr_out2[n:0] from partition 2 and a second data input coupled to receive vfy_addr_out2[n:0] from partition 2, and provides one of these to raddr_in3 of partition 3 based on max_read_mode at the control input of MUX 92. Therefore, note that vfy_addr_out2 is provided both as an input to partition 3 and input to MUX 92. Also, note that raddr_in3 of partition 3 can either receive raddr_out2[n:0] from partition 2 or vfy_addr_out2[n:0] from partition 2, depending on the value of max_read_mode. Note that, as with MUX 30 of FIG. 3, although MUX 92 is illustrated as a single MUX, it represents a set of n+1 MUXes (each coupled to receive a corresponding one of the n+1 bits of the normal read address bus and of the verify read address bus).)

In operation, if max_read_mode is negated, MUX 92 of bus sharing circuit 16 is transparent such that access addresses on the normal read address bus and on the verify read address bus through partition 2 are propagated, unchanged, on the normal read address bus and verify read address bus, respectively, through partition 3. However, if max_read_mode is asserted, MUX 92 routes the access address on the verify read address bus propagated through partition 2 to the normal read address bus through partitions 3 and 4. In this manner, as illustrated in the example of FIG. 6, simultaneous normal read access requests can be received and processed by NVM 10 (e.g. a first read access request to access address P4 in partition 4 and a second read access request to access address P2 in partition 2). In this example of FIG. 6, with max_read_mode asserted, access address P4 can be received by memory controller 18 at one of the input address ports (addr1 or addr2) and access address P2 can be received by memory controller 18 at the other one of the input address ports (the other of addr1 and addr2). Memory controller 18 can provide access address P2 via raddr to propagate through partition 1 to partition 2 on the normal read address bus, while memory controller 18 can provide access address P4 via vfy_addr to propagate through partitions 1 and 2 on the verify read address bus and then be rerouted by MUX 90 to propagate through partition 3 to partition 4 on the normal read address bus.

Therefore, with bus sharing enabled, memory controller 18 can perform two simultaneous normal read operations so long as only one of the simultaneous read operations accesses partition 3 or partition 4 (i.e. a partition after bus sharing circuit 16). Bus sharing allows the verify read address bus before bus sharing circuit 16, in addition to the normal read address bus, to be used for normal read access addresses. That is, bus sharing repurposes the verify read address bus through those partitions before bus sharing circuit 16 to be used as an additional normal read address bus. However, with bus sharing enabled, an access address in partition 3 or partition 4 can only be provided via the verify read address bus through partitions 1 and 2 since MUX 92 does not propagate raddr_out2 to raddr_in3. Note that although bus sharing circuit 16 of FIG. 9 is located between partitions 2 and 3, in alternate embodiments, it can be placed between any two partitions (or within any partition) in which bus sharing repurposes the verify read bus through those partitions before the bus sharing circuit to be used as an additional normal read bus to propagate normal read access addresses.

Therefore, by now it can be appreciated how the verify read bus can be repurposed to operate as a normal read bus in order to selectively double the read bandwidth from a partitioned NVM. In one embodiment, each of the normal read bus and verify read bus is implemented with daisy chained MUXes, in which each partition includes a portion of each bus. A bus sharing circuit can be used between two partitions in order to, based on a control signal, route normal read data onto the verify read bus so that the normal read bus, after the bus sharing circuit, can propagate read data for a simultaneous read access. In one embodiment, for the simultaneous read access, the bus sharing circuit can also be used to, based on the control signal, reroute an access address from a verify read address bus to a normal read address bus. In one embodiment, the control signal can be used to indicate when write operations are not occurring, so that bus sharing is enabled only when write operations are not occurring. In this manner, if a write operation is ongoing, then the normal read bus and verify read bus are kept separate, resulting in half the read bandwidth as compared to when bus sharing is enabled. Therefore, with the ability to selectively enable bus sharing when writes are not occurring, read bandwidth can be increased while maintaining the same pinouts (I/Os) of a two read port NVM memory (e.g. rdata1 and rdata2, each of n+1 bits).

As used herein, the term "bus" is used to refer to a plurality of signals or conductors, and corresponding circuitry, which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Also, while the buses described herein are implemented with daisy chained MUXes, other logic circuits can be used to implement the functionality of the daisy chain buses through each partition. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "bus 60 [7:0]" or "conductors [7:0] of bus 60" indicates the eight lower order conductors of bus 60, and "address bits [7:0]" or "ADDRESS [7:0]" indicates the eight lower order bits of an address value. The symbol "$" preceding a number indicates that the number is represented in its hexadecimal or base sixteen form. The symbol "%" or "b" preceding a number indicates that the number is represented in its binary or base two form.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, NVM 10 is implemented as an SoC with any type of additional circuitry located on a single integrated circuit or within a same device.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, NVM 10 can be partitioned into any number of partitions, include any number of bus sharing circuits between partitions, and can be daisy chained into any order, based on the design of NVM 10. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention. Note that any of the aspects below can be used in any combination with each other and with any of the disclosed embodiments.

In one embodiment, a non-volatile memory (NVM) having a daisy chained normal read bus and a daisy chained verify read bus includes a plurality of partitions, each partition including a portion of the daisy chained normal read bus and a portion of the daisy chained verify read bus; a memory controller coupled to receive read data in response to normal read access requests to the NVM via the daisy chained normal read bus and, in response to write access requests to the NVM, receive verify read data via the daisy chained verify read bus; and a bus sharing circuit coupled between a first partition of the plurality of partitions and a second partition of the plurality of partitions, the bus sharing circuit configured to, in response to a sharing control signal, selectively repurpose portions of the daisy chained verify read bus in at least one of the partitions of the plurality of partitions to communicate read data to the memory controller in response to a normal read access request to the NVM. In one aspect, the memory controller is configured to assert the sharing control signal to enable the repurposing when write operations to the NVM are not occurring. In a further aspect, the memory controller is configured to negate the sharing control signal to disable the repurposing when write operations to the NVM are occurring. In yet a further aspect, when the repurposing is disabled, the daisy chained verify read bus does not communicate read data in response to normal read access requests to the NVM. In yet an even further aspect, when the repurposing is disabled, the daisy chained verify read bus only communicates verify read data obtained during a write operation. In another aspect of the embodiment, the memory controller includes a first output read port and a second output read port, wherein when the repurposing is enabled, the memory controller is configured to output the received read data in response to the normal read access request on either the first output read port or the second output read port. In a further aspect, when the repurposing is disabled, the memory controller is configured to output the received read data in response to the normal read access request on only one of the first or second output read port in which another one of the first or second output read port is disabled. In another aspect, the portion of the daisy chained normal read bus in each corresponding partition includes a set of multiplexors (MUXes) which either provide read data from the corresponding partition or read data from a previous partition, based on a MUX control signal, as a normal read output of the portion of the daisy chained normal read bus for the corresponding partition, and the portion of a daisy chained verify read bus in each corresponding partition includes a set of verify MUXes which either provide verify read data from the corresponding partition or verify read data from the previous partition, based on a verify MUX control signal, as a verify read output of the portion of the daisy chained normal read bus for the corresponding partition. In a further aspect, the memory controller is configured to set values of the MUX control signals and the verify MUX control signals to the partitions based at least in part on the sharing control signal. In another further aspect, when the MUX control signal provided to the set of MUXes of the corresponding partition has a first value, the set of MUXes operates transparently to provide the read data from the previous partition as the normal read output of the portion of the daisy chained normal read bus for the corresponding partition, and when the MUX control signal provided to the set of MUXes of the corresponding partition has a second value, the set of MUXes generate read data from the corresponding partition to provide as the normal read output of the portion of the daisy chained normal read bus for the corresponding partition. In yet another further aspect, when the verify MUX control signal provided to the set of verify MUXes of the corresponding partition has a first value, the set of verify MUXes operates transparently to provide the verify read data from the previous partition as the verify read output of the portion of the daisy chained verify read bus for the corresponding partition, and when the verify MUX control signal provided to the set of verify MUXes of the corresponding partition has a second value, the set of verify MUXes generate verify read data from the corresponding partition to provide as the verify read output of the portion of the daisy chained verify read bus for the corresponding partition. In yet another further aspect, the bus sharing circuit further includes a set of repurposing MUXes which either provide the normal read output of the first partition or the verify read output of the first partition as the verify read data output of the previous partition which is input to the set of verify MUXes of the second partition based on the sharing control signal. In a further aspect, the first and second partitions include any two adjacent partitions of the plurality of partitions, the two adjacent partitions being adjacent with respect to a daisy chain order of the daisy chained normal read bus. In another further aspect, the NVM further includes a second bus sharing circuit coupled between a third partition and a fourth partition of the plurality of partitions, the second bus sharing circuit configured to, in response to a second sharing control signal, selectively repurpose portions of the daisy chained verify read bus in at least one of the partitions of the plurality of partitions to communicate read data to the memory controller in response to a normal read access request to the NVM.

In another embodiment, in a non-volatile memory (NVM) having dual output ports, a plurality of partitions, each partition including a portion of a daisy chained normal read bus and a portion of a daisy chained verify read bus, a method includes receiving a first normal read access request to a first partition of the plurality of partitions simultaneously with receiving a second normal read access request to a second partition of the plurality of partitions, different from the first partition, of the NVM; enabling bus sharing; propagating first read data output from the first partition in response to the first normal read access request to a controller of the NVM through the daisy chained normal read bus of a first portion of the plurality of partitions and through the daisy chained verify read bus of a second portion of the plurality of partitions, wherein the first and second portions are mutually exclusive; propagating second read data output from the second partition in response to the second normal read access request to the controller through the daisy chained normal read bus of all partitions of the plurality of partitions along a daisy chain order between the second partition and the controller; and outputting, by the controller, both the first read data and the second read data simultaneously on the dual output ports. In one aspect of the another embodiment, the NVM further includes a bus sharing circuit coupled between the first and second partitions, wherein, after the enabling bus sharing, the method further includes rerouting, by the bus sharing circuit, the first read data from the daisy chained normal ready bus of a partition immediately preceding the bus sharing circuit to the daisy chained verify read bus of a partition immediately following the bus sharing circuit. In a further aspect, the first portion of the plurality of partitions precedes the bus sharing circuit and the second portion of the plurality of partitions follows the bus sharing circuit. In another aspect, the method further includes disabling bus sharing; and, in response to disabling the bus sharing, disabling a first output port of the dual output ports so as to enable only a second output port of the dual output ports. In a further aspect, the method further includes receiving a third normal read access request to a third partition of the plurality of partitions while a write access is ongoing to a fourth partition of the plurality of partitions, different from the third partition; after the disabling the bus sharing, propagating third read data output from the third partition in response to the third normal read access request through the daisy chained normal read bus to the second output port; and, after the disabling the bus sharing, propagating verify read data output from the fourth partition in response to a verify read of the ongoing write access through the daisy chained verify read bus, wherein the verify read data is not provided via any output port of the NVM. In yet a further aspect, the third read data is not propagated through the daisy chained verify read bus of any partitions of the plurality of partitions. In another aspect of the another embodiment, the NVM further includes dual address input ports, a normal read address bus, and a verify read address bus, wherein a first read access address of the first normal read access request is received at one of the dual address input ports and a second read access address of the second normal read access request is received at another one of the dual address input ports, and the method further includes propagating the first read access address to the first partition on the verify read address bus through the second portion of the plurality of partitions and on the normal read address bus through the first portion of the plurality of partitions; and propagating the second read access address to the second partition on the normal read address bus, wherein the second read access address is not propagated on the verify read address bus.

What is claimed is:

1. A non-volatile memory (NVM) having a daisy chained normal read bus and a daisy chained verify read bus, the NVM comprising:
 a plurality of partitions, each partition including a portion of the daisy chained normal read bus and a portion of the daisy chained verify read bus;
 a memory controller coupled to receive read data in response to normal read access requests to the NVM via the daisy chained normal read bus and, in response to write access requests to the NVM, receive verify read data via the daisy chained verify read bus; and
 a bus sharing circuit coupled between a first partition of the plurality of partitions and a second partition of the plurality of partitions, the bus sharing circuit configured to, in response to a sharing control signal, selectively repurpose portions of the daisy chained verify read bus in at least one of the partitions of the plurality of partitions to communicate read data to the memory controller in response to a normal read access request to the NVM.

2. The NVM of claim 1, wherein the memory controller is configured to assert the sharing control signal to enable the repurposing when write operations to the NVM are not occurring.

3. The NVM of claim 2, wherein the memory controller is configured to negate the sharing control signal to disable the repurposing when write operations to the NVM are occurring.

4. The NVM of claim 3, wherein when the repurposing is disabled, the daisy chained verify read bus does not communicate read data in response to normal read access requests to the NVM.

5. The NVM of claim 4, wherein when the repurposing is disabled, the daisy chained verify read bus only communicates verify read data obtained during a write operation.

6. The NVM of claim 1, wherein the memory controller comprises a first output read port and a second output read port, wherein when the repurposing is enabled, the memory controller is configured to output the received read data in response to the normal read access request on either the first output read port or the second output read port.

7. The NVM of claim 6, wherein when the repurposing is disabled, the memory controller is configured to output the received read data in response to the normal read access request on only one of the first or second output read port in which another one of the first or second output read port is disabled.

8. The NVM of claim 1, wherein:
 the portion of the daisy chained normal read bus in each corresponding partition comprises:
  a set of multiplexors (MUXes) which either provide read data from the corresponding partition or read data from a previous partition, based on a MUX control signal, as a normal read output of the portion of the daisy chained normal read bus for the corresponding partition, and
 the portion of a daisy chained verify read bus in each corresponding partition comprises:
  a set of verify MUXes which either provide verify read data from the corresponding partition or verify read data from the previous partition, based on a verify MUX control signal, as a verify read output of the portion of the daisy chained normal read bus for the corresponding partition.

9. The NVM of claim 8, wherein the memory controller is configured to set values of the MUX control signals and the verify MUX control signals to the partitions based at least in part on the sharing control signal.

10. The NVM of claim 8, wherein when the MUX control signal provided to the set of MUXes of the corresponding partition has a first value, the set of MUXes operates transparently to provide the read data from the previous partition as the normal read output of the portion of the daisy chained normal read bus for the corresponding partition, and when the MUX control signal provided to the set of MUXes of the corresponding partition has a second value, the set of MUXes generate read data from the corresponding partition to provide as the normal read output of the portion of the daisy chained normal read bus for the corresponding partition.

11. The NVM of claim 8, wherein when the verify MUX control signal provided to the set of verify MUXes of the corresponding partition has a first value, the set of verify MUXes operates transparently to provide the verify read data from the previous partition as the verify read output of the portion of the daisy chained verify read bus for the corresponding partition, and when the verify MUX control signal provided to the set of verify MUXes of the corresponding partition has a second value, the set of verify MUXes generate verify read data from the corresponding partition to provide as the verify read output of the portion of the daisy chained verify read bus for the corresponding partition.

12. The NVM of claim 8, wherein the bus sharing circuit further comprises:
 a set of repurposing MUXes which either provide the normal read output of the first partition or the verify read output of the first partition as the verify read data output of the previous partition which is input to the set of verify MUXes of the second partition based on the sharing control signal.

13. The NVM of claim 12, wherein the first and second partitions comprise any two adjacent partitions of the plurality of partitions, the two adjacent partitions being adjacent with respect to a daisy chain order of the daisy chained normal read bus.

14. A method for operating a non-volatile memory (NVM) having dual output ports, a plurality of partitions, each partition including a portion of a daisy chained normal read bus and a portion of a daisy chained verify read bus, the method comprising:
 receiving a first normal read access request to a first partition of the plurality of partitions simultaneously with receiving a second normal read access request to a second partition of the plurality of partitions, different from the first partition, of the NVM; enabling bus sharing; propagating first read data output from the first partition in response to the first normal read access request to a controller of the NVM through the daisy chained normal read bus of a first portion of the plurality of partitions and through the daisy chained verify read bus of a second portion of the plurality of partitions, wherein the first and second portions are mutually exclusive; propagating second read data output from the second partition in response to the second normal read access request to the controller through the daisy chained normal read bus of all partitions of the plurality of partitions along a daisy chain order between the second partition and the controller; and outputting, by the controller, both the first read data and the second read data simultaneously on the dual output ports.

15. The method of claim 14, wherein the NVM further includes a bus sharing circuit coupled between the first and second partitions, wherein, after the enabling bus sharing, the method further comprises:
rerouting, by the bus sharing circuit, the first read data from the daisy chained normal ready bus of a partition immediately preceding the bus sharing circuit to the daisy chained verify read bus of a partition immediately following the bus sharing circuit.

16. The method of claim 15, wherein the first portion of the plurality of partitions precedes the bus sharing circuit and the second portion of the plurality of partitions follows the bus sharing circuit.

17. The method of claim 14, further comprising:
disabling bus sharing; and
in response to disabling the bus sharing, disabling a first output port of the dual output ports so as to enable only a second output port of the dual output ports.

18. The method of claim 17, further comprising:
receiving a third normal read access request to a third partition of the plurality of partitions while a write access is ongoing to a fourth partition of the plurality of partitions, different from the third partition;
after the disabling the bus sharing, propagating third read data output from the third partition in response to the third normal read access request through the daisy chained normal read bus to the second output port; and
after the disabling the bus sharing, propagating verify read data output from the fourth partition in response to a verify read of the ongoing write access through the daisy chained verify read bus, wherein the verify read data is not provided via any output port of the NVM.

19. The method of claim 18, wherein the third read data is not propagated through the daisy chained verify read bus of any partitions of the plurality of partitions.

20. The method of claim 14, wherein the NVM further includes dual address input ports, a normal read address bus, and a verify read address bus, wherein a first read access address of the first normal read access request is received at one of the dual address input ports and a second read access address of the second normal read access request is received at another one of the dual address input ports, the method further comprising:
propagating the first read access address to the first partition on the verify read address bus through the second portion of the plurality of partitions and on the normal read address bus through the first portion of the plurality of partitions; and
propagating the second read access address to the second partition on the normal read address bus, wherein the second read access address is not propagated on the verify read address bus.

* * * * *